United States Patent
Jung

(10) Patent No.: US 7,294,889 B2
(45) Date of Patent: Nov. 13, 2007

(54) SEMICONDUCTOR DEVICE HAVING A WELL STRUCTURE FOR IMPROVING SOFT ERROR RATE IMMUNITY AND LATCH-UP IMMUNITY AND A METHOD OF MAKING SUCH A DEVICE

(75) Inventor: Hyuck-Chai Jung, Kyungki-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 284 days.

(21) Appl. No.: 10/961,927

(22) Filed: Oct. 8, 2004

(65) Prior Publication Data

US 2005/0079668 A1 Apr. 14, 2005

(30) Foreign Application Priority Data

Oct. 9, 2003 (KR) .................... 10-2003-0070310

(51) Int. Cl.
H01L 29/76 (2006.01)
(52) U.S. Cl. .................... 257/371; 257/659; 257/903
(58) Field of Classification Search ................ 257/371, 257/659, 903
See application file for complete search history.

(56) References Cited

U.S. PATENT DOCUMENTS 5,877,051 A 3/1999 Manning 6,472,715 B1 10/2002 Liu et al.
6,500,705 B2 * 12/2002 Kumagai .................... 438/223

FOREIGN PATENT DOCUMENTS

JP 2001-057393 2/2001
KR 1020030001971 8/2003

OTHER PUBLICATIONS

English language abstract of Korea Publication No. 1020030001971.
English language abstract of Japan Publication No. 2001-057393.
Richard S. Muller and Theodore "Device Electronics For Integrated Circuits", pp. 458-465.

* cited by examiner

*Primary Examiner*—Mark V. Prenty
(74) *Attorney, Agent, or Firm*—Marger Johnson & McCollom, P.C.

(57) ABSTRACT

A semiconductor device with improved soft error rate immunity and latch-up immunity and a method of forming the same. The device includes first wells of first conductivity type and second well of second conductivity type formed in the semiconductor substrate of first conductivity type. First conductivity type MOSFETs including source/drain of first conductivity type are formed in the second well, and second conductivity type MOSFETs including source/drain of second conductivity type in the first well. A third well of second conductivity type is formed at a region under the first wells and the drain of the second conductivity type MOSFETs. The first well is connected to the semiconductor substrate between the first well and the third well.

14 Claims, 13 Drawing Sheets

SEMICONDUCTOR DEVICE HAVING A WELL STRUCTURE FOR IMPROVING SOFT ERROR RATE IMMUNITY AND LATCH-UP IMMUNITY AND A METHOD OF MAKING SUCH A DEVICE

This U.S. non-provisional patent application claims priority under 35 U.S.C. § 119 of Korean Patent Application 2003-70310 filed on Oct. 9, 2003. The entire content of Korean Patent Application 2003-70310 is hereby incorporated herein by reference.

BACKGROUND OF THE INVENTION

1. Field of this Invention

This invention relates to semiconductor memory devices and to methods of fabricating semiconductor memory devices. More particularly, the present invention relates to semiconductor memory devices that have a well structure for improving soft error rate immunity and latch-up immunity and to a method of fabricating such devices.

2. Description of Prior Art

Complementary metal oxide semiconductor devices (CMOS devices) have excellent power dissipation, noise margin and reliability characteristics, and they are widely used in many semiconductor products including memories, microprocessors and application specific integrated circuits (ASICs).

CMOS devices may not only be used in memory cell regions but they may also be used in peripheral circuit regions of static RAMs (SRAMs). SRAMs that use CMOS devices have small standby current requirements and high data retention. The unit cell of an SRAM generally includes two driver transistors, two access transistors and two load transistors. The driver and access transistors in an SRAM cell can be NMOSFETs and the load transistors can be PMOSFETs. Such unit cells, called "a full CMOS cells", require only a small standby current and they have a large noise margin. They are therefore widely used in high-performance SRAMs that have a low power supply voltage.

CMOS devices such as CMOS inverters may sometimes suffer from problems such as soft errors and latch-up. A soft error is a process in which an electron-hole pair (EHP) generated in the semiconductor substrate by alpha particles or cosmic ray, destroys information stored in the memory cell. This loss of information occurs when electric charges in specific nodes (e.g., a lower electrode of the capacitor in the DRAM or a drain of the driver transistor in the SRAM) exceed a critical quantity. Even if a semiconductor device is highly integrated, the capacitor in a DRAM must have a relatively high capacitance. As a result, soft errors in DARMs do not present a significant problem in highly integrated DARMs. However, since SRAMs do not use a capacitor as the memory cell for storing information, reduction of capacitance accompanies high integration. Consequently, as the integration of SRAMs is increased, a technique for improving the soft error rate immunity is highly desired.

One conventional technique for improving the soft error rate immunity is disclosed in U.S. Pat. No. 5,877,051. Such a prior art technique is illustrated in FIG. 1 which is a schematic cross-sectional view of a semiconductor device.

As shown in FIG. 1, a plurality of N-wells 20n and P-wells 20p are disposed in predetermined regions of the semiconductor substrate 10. A plurality of PMOSFETs are formed at the N-well 20n, and a plurality of NMOSFETs are formed at the P-well 20p. The NMOSFETs and the PMOSFETs include a gate insulation layer 50 and gate electrodes 30. The gate insulation layer 50 is formed on the active region defined by the device isolation layer 15 and the gate electrodes 30 are formed on the gate insulation layer 50. In addition, the NMOSFETs include N-type impurity regions 40n formed in the P-well 20p, and the PMOSFETs include P-type impurity region 40p formed in the N-well 20n. These NMOSFETs and PMOSFETs can be connected with predetermined interconnections (not shown) to form a CMOS inverter, a flip-flop circuit, a CMOS SRAM cell or the like.

In a conventional method of improving the soft error rate immunity, a deep N-well 60n is formed under the P-well 20p. The deep N-well 60n plays a role in reducing the generation EHPs by shortening the funneling length of high energy particles. In addition, the deep N-well 60n collects a part of the charges generated by high energy particles to decrease the electric charges accumulated in a node of the inverter. However, the deep N-well 60n may deteriorate the latch-up immunity.

Latch-up is an important technical problem in CMOS devices. Latch-up is described in various textbooks. For example, see "Device Electronics for Integrated Circuits", pp. 458-456, by Richard S. Muller and Theodore I. Kamins. Latch-up results from the structure of parasitic thyristor formed by the NMOSFETs and PMOSFETs. As described by Muller, susceptibility to latch-up may be decreased by reducing well resistance. This reduction in well resistance enables the electrons to be discharged fast, so as to prevent an abnormal variation of the well potential. Latch-up may be particularly serious in case of holes rather than electrons because of the difference in mobility. Therefore, the art of reducing the latch-up susceptibility is generally focused on reducing the electric resistance of the P-well 20p.

FIG. 2 is a cross-sectional view for illustrating a prior art method of reducing the P-well resistance. FIGS. 3A and 3B are resistor circuit diagrams for illustrating schematically electric resistances of the P-wells in FIGS. 1 and 2, respectively.

First, as shown in FIG. 1, the bottom surface and the sidewall of the P-well 20p are surrounded by N-type wells 20n and 60n. This configuration corresponds to a long-line shaped resistor structure shown in FIG. 3A. The resistance of the P-well 20p is determined by distances between conductive structures (e.g., well strappings) that are connected to the P-well 20p in the state of forward bias. The integration density of the conductive structures connected to the P-well 20p should be increased to decrease the well resistance. However, this method for increasing a density of the well pick-up is undesirable because it may degrade integration density of the semiconductor devices.

As illustrated in FIG. 2, the well structure may be formed without forming the deep N-well 60n. In this case the N-type wells 20n and 60n do not surround the P-well 20p. As illustrated in FIG. 3B, the well structure corresponds to a resistor structure that wells are connected in parallel. This parallel connection structure of resistor reduces the resistance of the P-well 20p, and the latch up susceptibility can be decreased. However, the well structure without the deep N-well 60n formed under the P-well 20p results in reducing the soft error immunity.

SUMMARY OF THE INVENTION

The present invention provides a CMOS device that has improved soft error and latch up immunities.

A CMOS deice according to the present invention includes first wells of first conductivity type and second wells of second conductivity type formed in a semiconductor substrate of first conductivity type. A first conductivity type MOSFETs including a source and drain of first conductivity type are formed in the second well. A second conductivity type MOSFETs including a source and drain of a second conductivity type are formed in the first well. A third well of a second conductivity type disposed under both the first wells and the drain of the second conductivity type MOSFETs.

The first wells can be connected to the semiconductor substrate between the third wells. A fourth well of first conductivity type can be disposed in the semiconductor substrate under and between the third wells, and the first wells can be connected to the fourth well between the third wells. The third well can be connected to a bottom of the second well. The third well can be formed under the entire region of the second well.

The first conductivity type MOSFETs can form the load transistors of an SRAM, and the second conductivity type MOSFETs can form the driver transistors and the transfer transistors of an SRAM.

BRIEF DESCRIPTION OF THE DRAWINGS

FIGS. 5A through 8A are top plan views illustrating one embodiment of the present invention adapted in a memory cell of a CMOS SRAM cell.

FIGS. 5B through 8B are cross-sectional views taken along a dotted line I-I' in FIGS. 5A through 8A.

DETAILED DESCRIPTION OF THE PREFERRED EMBODIMENTS

Figure 1:
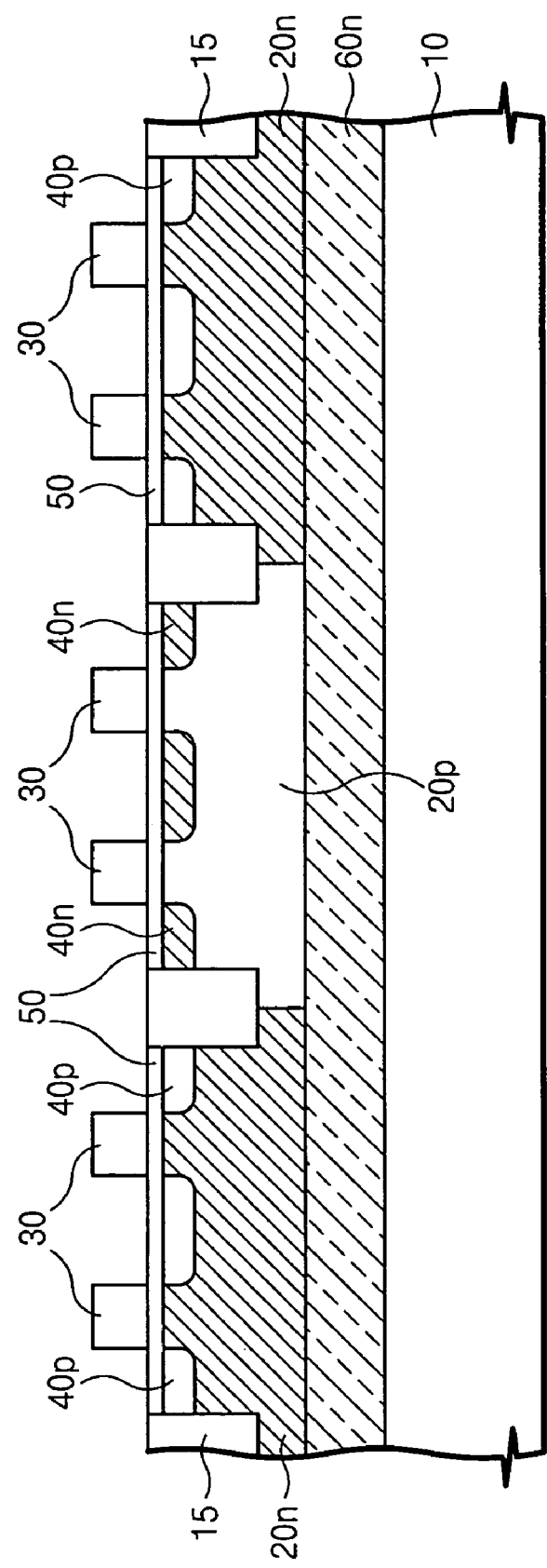
FIG. 1 is a cross-sectional view illustrating a well structure of CMOS device according to one embodiment of the prior art.
Figure 2:
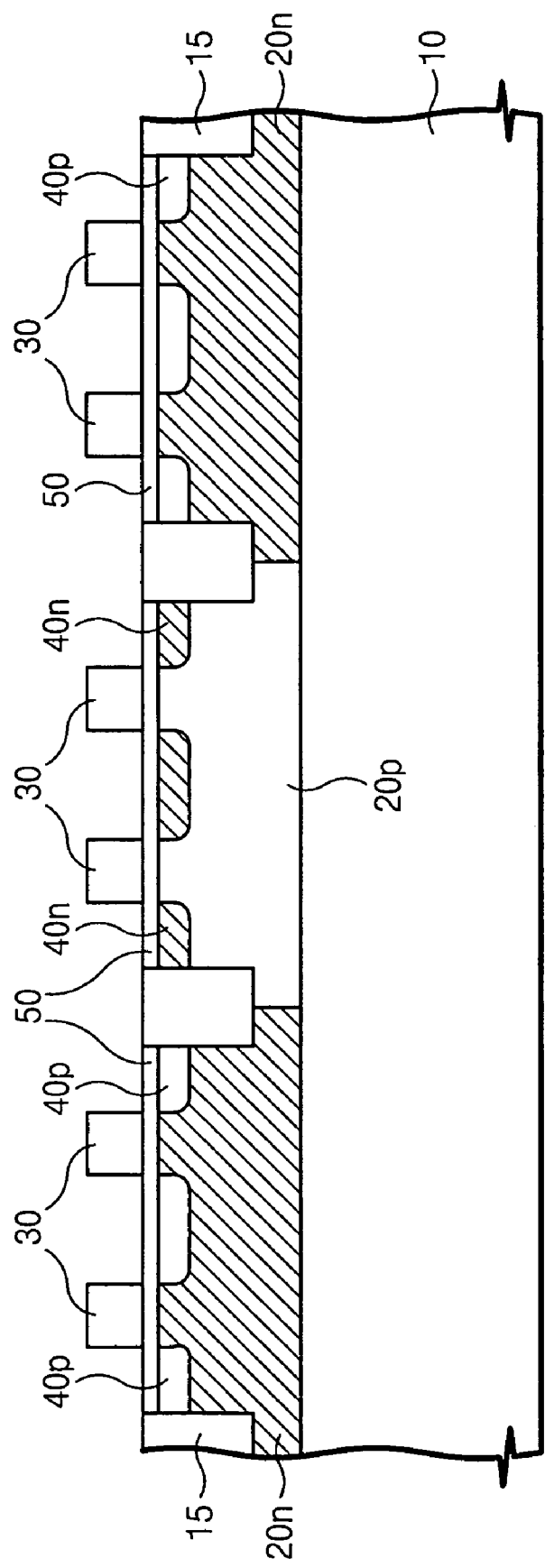
FIG. 2 is a cross-sectional view illustrating a well structure of CMOS device according to another embodiment of the prior art.
Figure 3A:
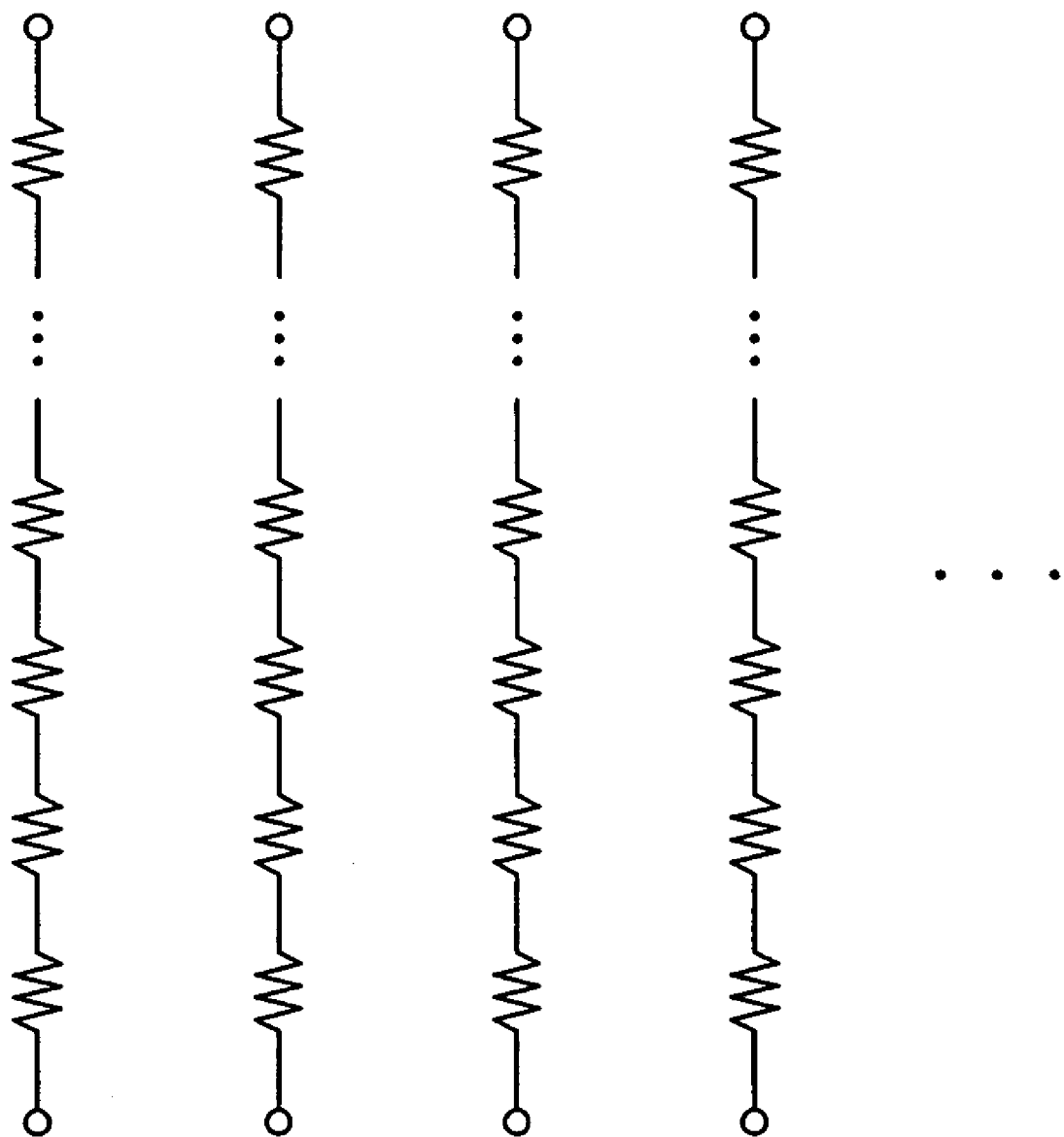
FIG. 3A and FIG. 3B are schematic resistor-circuit diagrams illustrating electric resistors of the CMOS devices in FIG. 1 and FIG. 2.
Figure 3B:
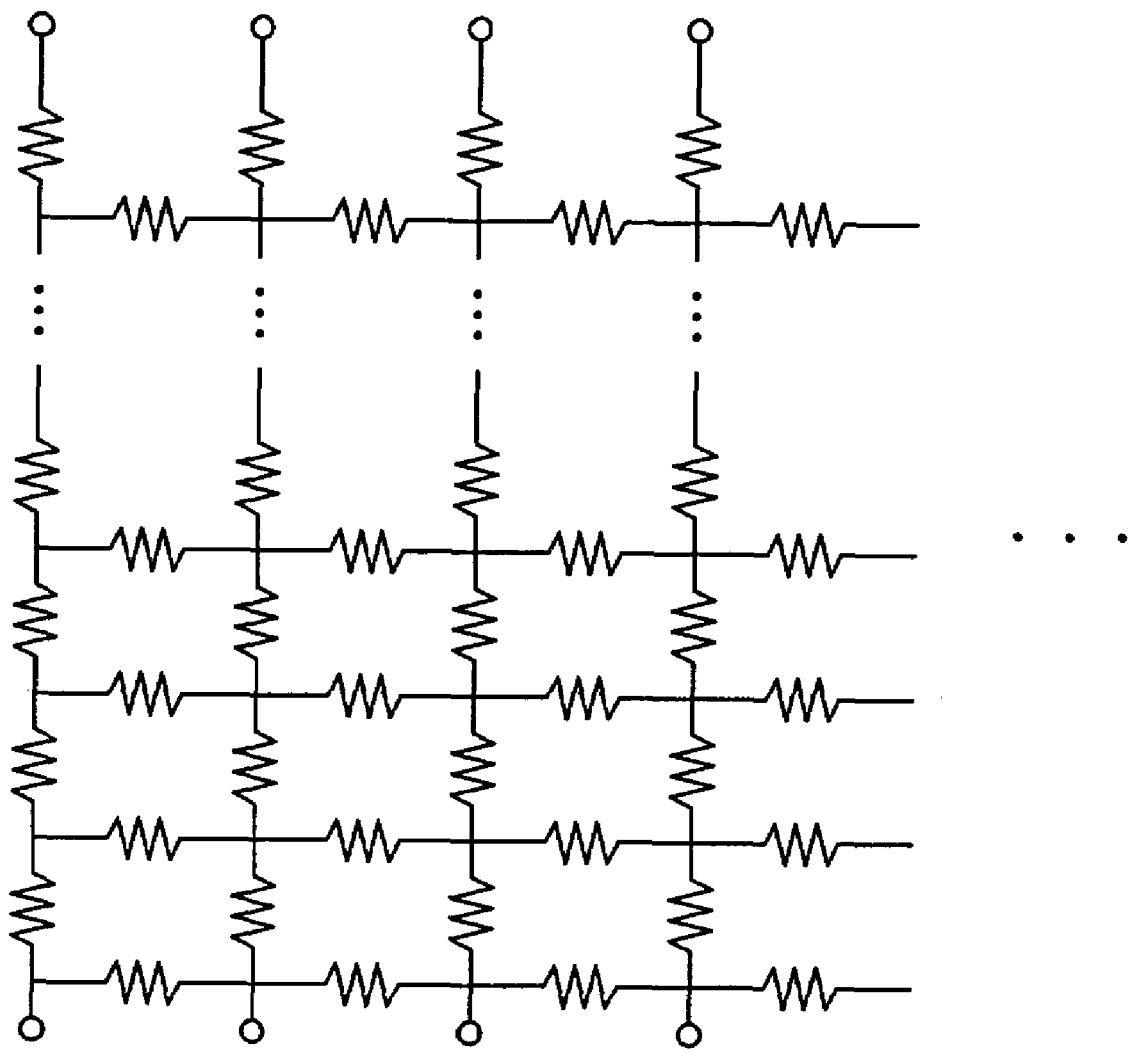

The present invention will be described more fully hereinafter with reference to the accompanying drawings, in which preferred embodiments of the invention are shown. This invention may, however, be embodied in many different forms and should not be construed as limited to the embodiments set forth herein. It is noted that in the drawings, the thickness of layers and regions are exaggerated for clarity. It will also be understood that when a layer is referred to as being "on" another layer or substrate, it can be directly on the other layer or substrate, or intervening layers may also be present.

The present invention may be applied to the memory cells of CMOS SRAMs. One embodiment of the present invention applied to a CMOS SRAM will be explained with reference to FIGS. 5A through 8A and FIGS. 5B through 8B. However, the present invention may also be used in various other CMOS devices including CMOS inverters (for example, CMOS devices such as a flip-flop circuits).

Figure 4:
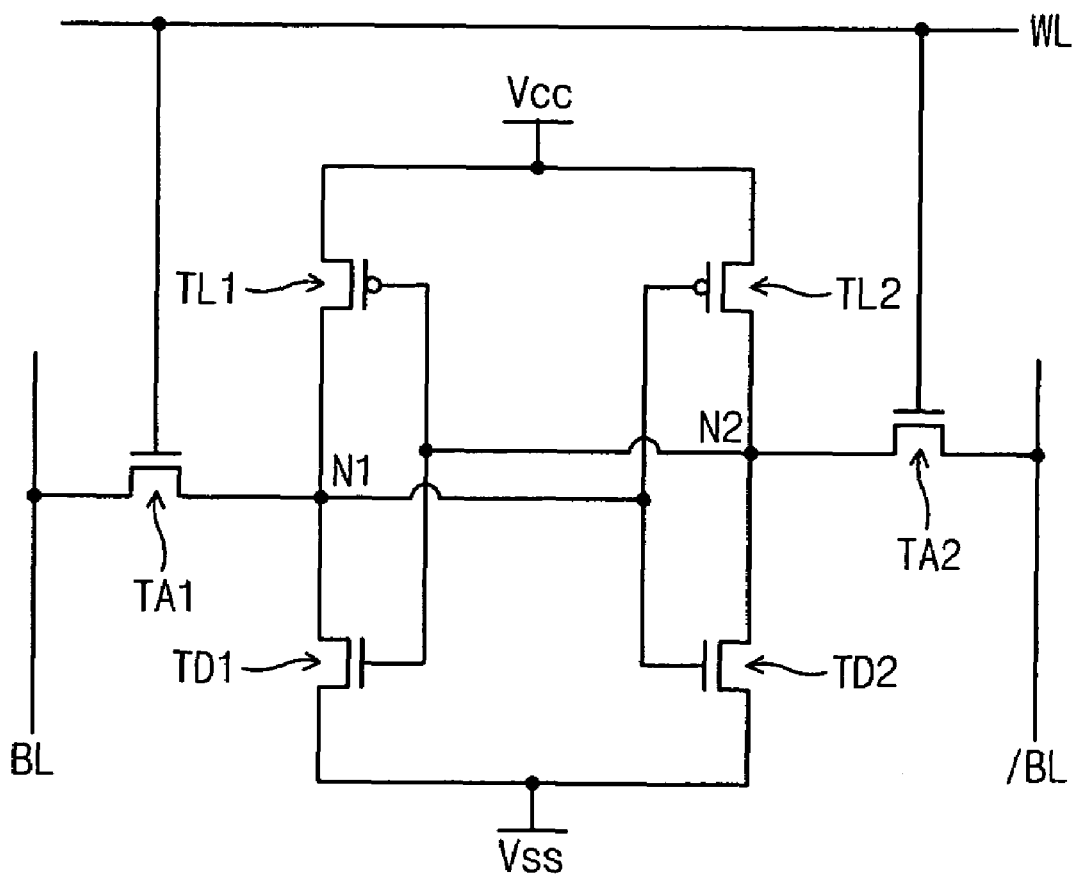
FIG. 4 is an equivalent circuit diagram of a conventional CMOS SRAM cell.

A conventional CMOS SRAM cell will be explained first. FIG. 4 illustrates an equivalent circuit diagram of the CMOS SRAM cell that includes a CMOS device including a CMOS inverter.

Referring to FIG. 4, the CMOS SRAM cell comprises a pair of driver transistors TD1 and TD2, a pair of transfer transistors TA1 and TA2 and a pair of load transistors TL1 and TL2. The pair of driver transistors TD1 and TD2 and the pair of transfer transistors TA1 and TA2 are all NMOS transistors, but the pair of load transistors TL1 and TL2 are PMOS transistors.

The first driver transistors TD1 and the first transfer transistor TA1 are connected in series. A source region of the first driver transistor TD1 is connected to a ground line Vss, and a drain region of the first transfer transistor TA1 is connected to a first bit line BL. Similarly, the second driver transistor TD2 and the second transfer transistor TA2 are connected in series. A source region of the second driver transistor TD2 is connected to the ground line Vss, and a drain region of the second transfer transistor TA2 is connected to a second bit line/BL.

The source region and the drain region of the first lead transistor TL1 are connected to the power line Vcc and the drain region of the first driving transistor TD1, respectively. Similarly, the source region and the drain region of the second load transistor TL2 are connected to the lower line Vcc and the drain region of the second driving transistor TD2, respectively. The drain region of the first load transistor TL1, the drain region of the first driving transistor TD1 and the source region of the first transfer transistor TA1 correspond to a first node N1. In addition, the drain region of the second load transistor TL2, the drain region of the second driver transistor TD2 and the source region of the second transfer transistor TA2 correspond to a second node N2. The gate electrode of the first driver transistor TD1 and the gate electrode of the first load transistor TL1 are connected to the second node N2. The gate electrode of the second driver transistor TD2 and the gate electrode of the second load transistor TL2 are connected to the first node N1. In addition, gate electrodes of first and second transfer transistors TA1 and TA2 are connected to a word line WL.

FIGS. 5A, 6A, 7A and 8A are top views illustrating one embodiment of the present invention applied to a CMOS SRAM memory cell. FIGS. 5B, 6B, 7B and 8B are cross-sectional views each taken along a dotted line I-I' in FIGS. 5A, 6A, 7A and 8A.

Figure 5A:
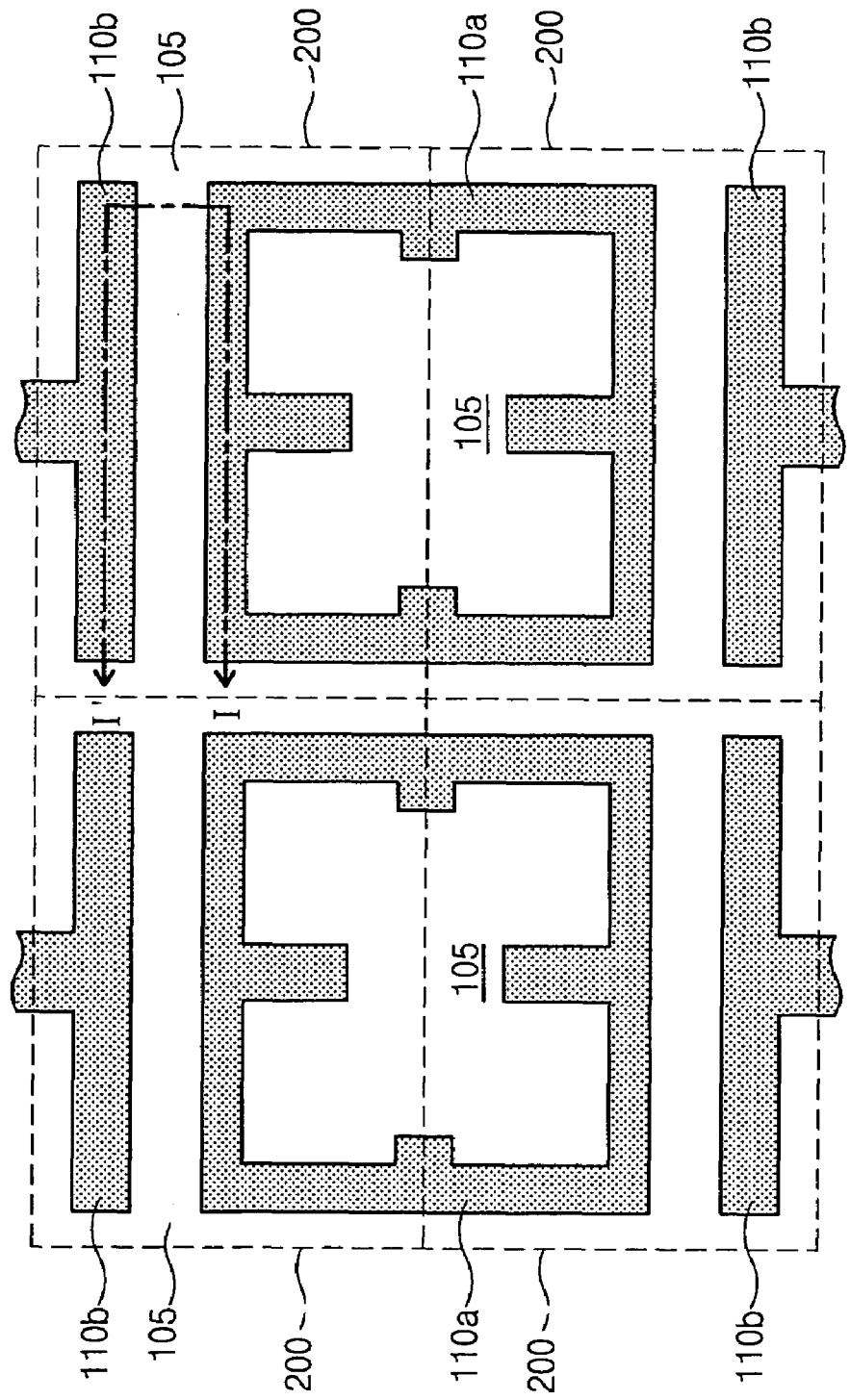
Figure 5B:
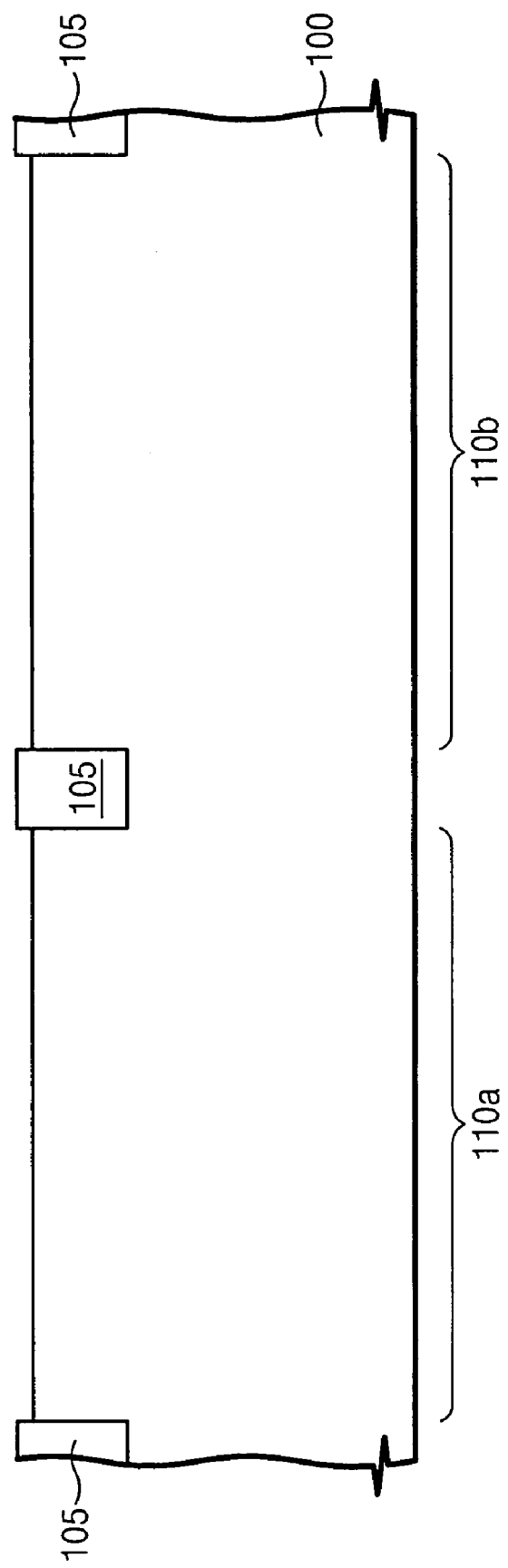

Referring to FIG. 5A and FIG. 5B, a device isolation layer 105 is formed in a predetermined region of the semiconductor substrate 100 to define first and second active regions 110a and 110b. The device isolation layer 105 may be formed by a conventional device isolation technique, for example, a trench device isolation technique. In this case, a conductivity type of the semiconductor substrate 100 may be P type but alternatively in other embodiments it can be N type.

The first active region 110a is a region where the first and second driver transistors TD1 and TD2 and the first and second transistors TA1 and TA2 are formed. One of the first active regions 110a is symmetrically formed on the basis of a boundary of the unit cell 200 in neighboring two unit cells 200. Especially, the first active region 110a forms a closed line including two internal protruding parts.

The second active region 110b is the region where the first and second load transistors TL1 and TL2 are formed. In the neighboring two unit cells 200, one of the second active regions 110b is formed symmetrically on the basis of a boundary of the unit cell 200. Especially, the second active region 110b forms H-shape in the neighboring unit cells 200 as illustrated in FIG. 5A. Meanwhile, the first and second active regions 110a and 110b disposed in a predetermined unit cell 200 are placed across different neighboring unit cells 200, respectively.

Figure 6A:
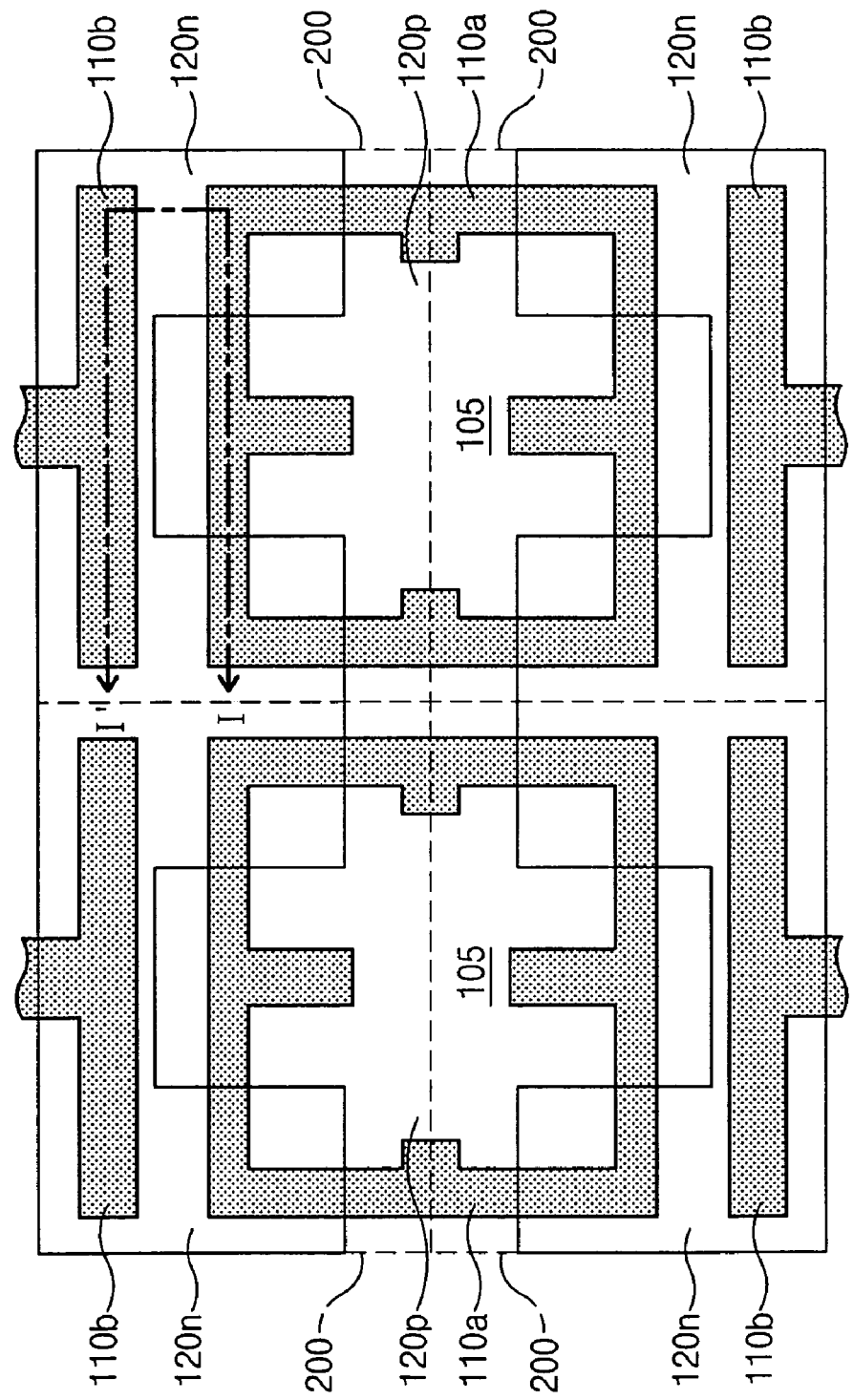
Figure 6B:
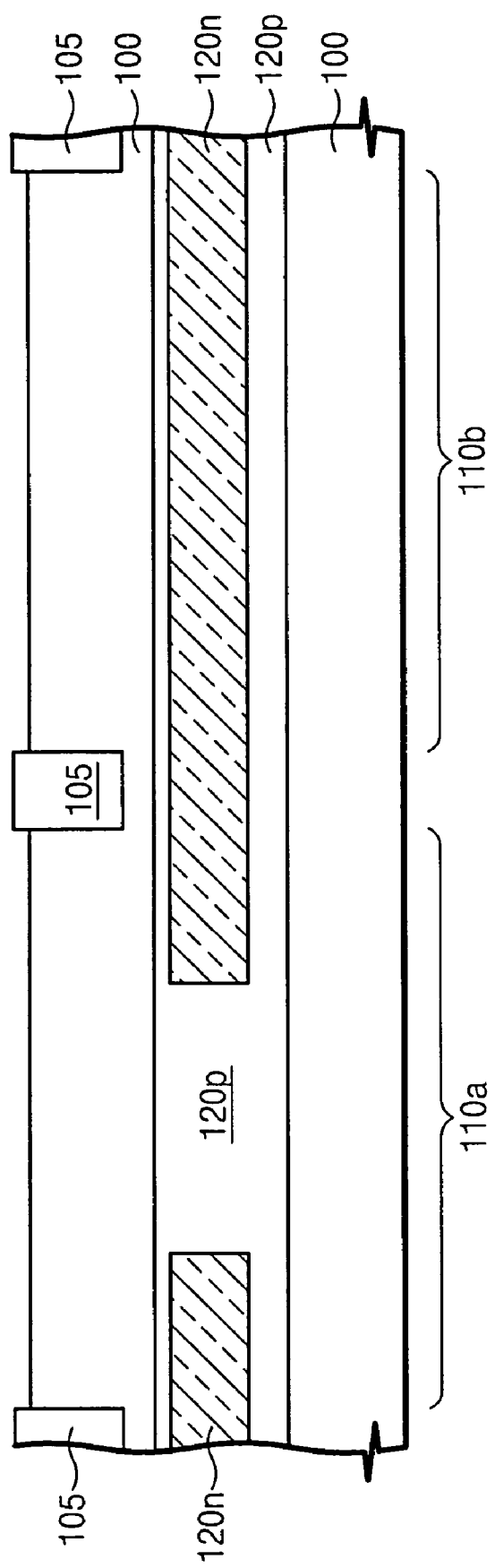

Referring to FIGS. 6A and 6B, a deep P-well 120p is formed in semiconductor substrate 100 including the device isolation layer 105. The deep P-well 120p may be formed using an ion-implantation technique. Preferably, the deep P-well 120p is formed on an entire surface of the semiconductor substrate 100 using a blanket ion implantation technique. However, alternatively, the deep P-well 120p may be formed in a predetermined region of the substrate (e.g., a memory cell array region, etc.).

The deep P-well 120p plays a role in reducing the electrical resistance of each of the P-wells 130p by connecting the P-wells 130p (in FIGS. 7A and 7B) which are formed in parallel in a subsequent process. Deep P-well 120p may have a depth such that a top portion of the deep P-well 120p is connected to a bottom portion of the P-wells 130p. According to one embodiment of the present invention, the deep P-well 120p is formed with a depth of about 0.3 to 1.0 µm below the top surface of the semiconductor substrate 100, so as to have a thickness of 0.3 to 1.0 µm downwardly.

Deep N-wells 120n are formed in the semiconductor substrate 100 including the deep P-well 120p. The deep N-wells 120n are formed locally in predetermined regions of the semiconductor substrate 100 instead of being formed in an entire surface of the semiconductor substrate 100. This is in contrast to the deep P-well 120p. The deep N-wells 120n may be formed under a portion of the N-type impurity regions of the NMOSFET, which is completely formed in subsequent processes.

In CMOS SRAMs, the deep N-wells 120n are formed under the drains of the first and second driver transistors TD1 and TD2, which will be formed in subsequent processes. That is, the deep N-wells 120n are formed under four edges of the first active region 110a as illustrated in FIG. 6A.

The deep N-wells 120n may be formed inside the deep P-well 120p with a thickness thinner than that of the deep P-well 120p (see FIG. 6B). Therefore, the deep P-well 120p is disposed between the deep N-wells 120n.

In an alternate embodiment, the order of forming the deep P-well 120p and the deep N-well 120n is changed. That is, after the deep N-well 120n is formed first, the deep P-well 120p may be formed.

Figure 7A:
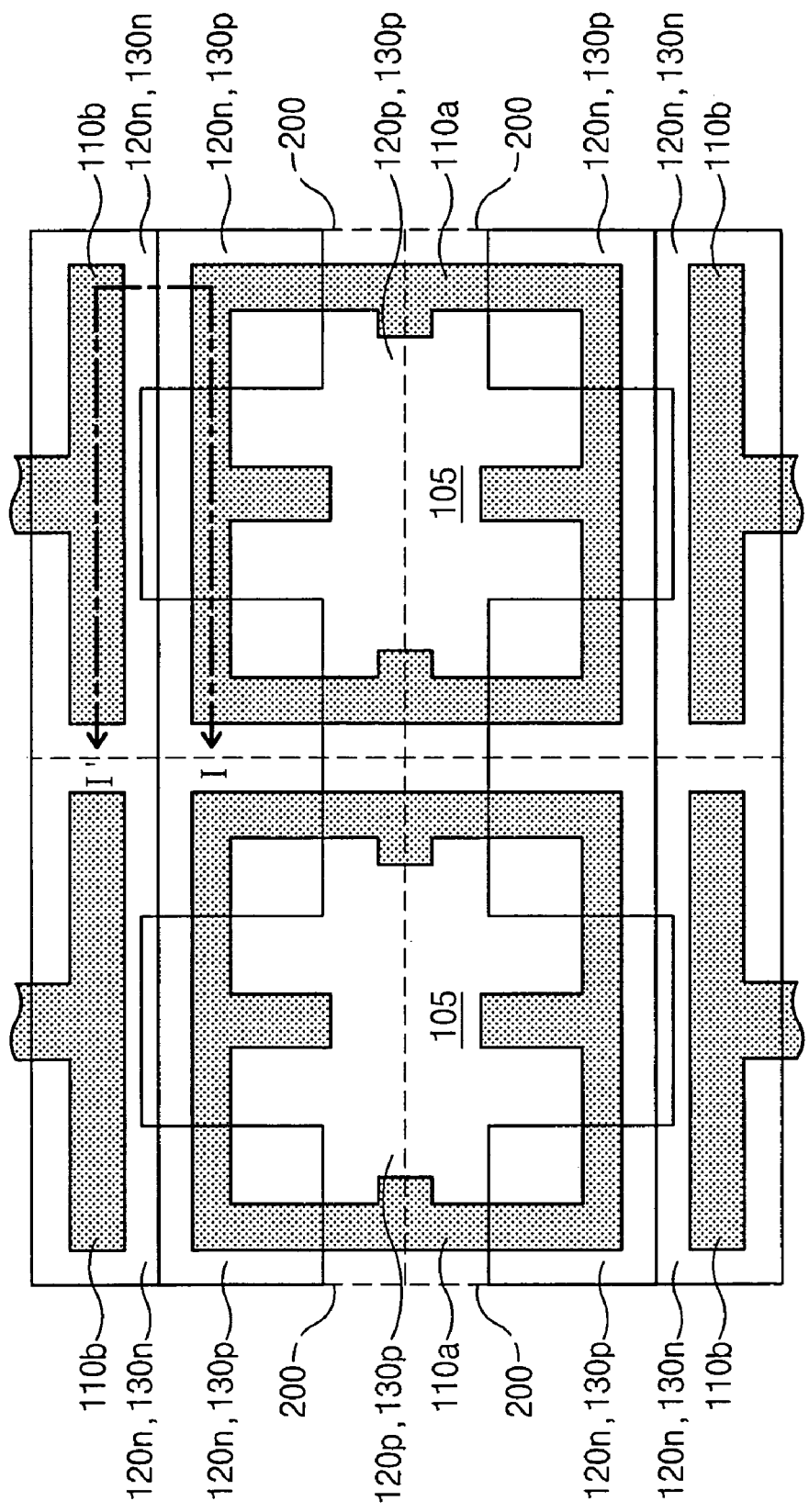
Figure 7B:
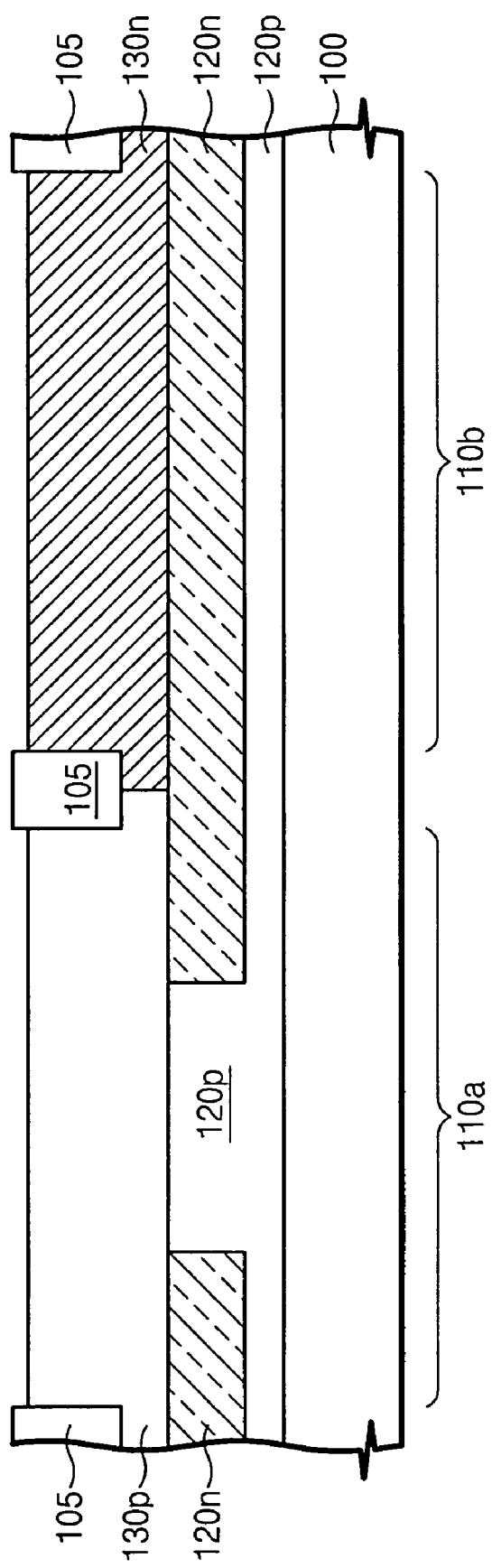

Referring to FIGS. 7A and 7B, a P-well 130p and an N-well 130n are sequentially formed in the semiconductor substrate 100 including the deep P-well 120p and the deep N-well 120n. The P-well 130p and the N-well 130n are disposed over the deep P-well 120p and the deep N-well 120n, neighboring to each other.

The P-wells 130p are formed in the first active region 110a, and the N-wells 130n are formed in the second active region 110b. The P-well 130p and the N-well 130n may be formed using ion implantation. The ion implantation process used to form the P-well 130p uses a mask for screening the second active region 110b but opening the first active region 110a. The ion implantation process for forming the N-well 130n may use a mask for screening the first active region 110a but opening the second active region 110b. Therefore, the P-wells 130p are connected to a top portion of the deep P-well 120p having the same conductivity type as that of the P-wells 130p. The N-wells 130n is connected to a top portion of the deep N-wells 120n having the same conductivity type as that of the N-wells 130n. Meanwhile, the deep N-wells 120n may be formed under an entire bottom surface of the N-well 130n. However, the deep N-wells 130n may be connected to the N-well 130n only at predetermined regions.

Alternatively, the order of forming the P-well 130p and the N-well 130n may be exchanged. That is, the P-well 130p may be formed after the N-well 130n is formed. In addition, the orders of forming the P-well 130p, the N-well 130n, the deep P-well 120p and the deep N-well 120n may be exchanged according to various combinations.

The deep P-well 120p is disposed between the deep N-wells 120n and connected to a bottom of the P-wells 130p, as illustrated FIGS. 6A and 6B, such that electrical resistances of the P-wells 130p may be lowered. Holes in the P-well 130p may be effectively discharged by lowering the electric resistance of the P-well 130p. Therefore, a latch up caused by a voltage variation of the P-well 130p can be decreased.

According to another embodiment of the present invention, the deep P-well 130p may not be formed. In this case, an electric resistor of the P-wells 130p may be reduced by the semiconductor substrate 100 of the same conductivity type as that of the P-well 130p. For this embodiment, the N-wells 120n is formed locally so as to connect the P-wells 130p to the semiconductor substrate 100.

Figure 8A:
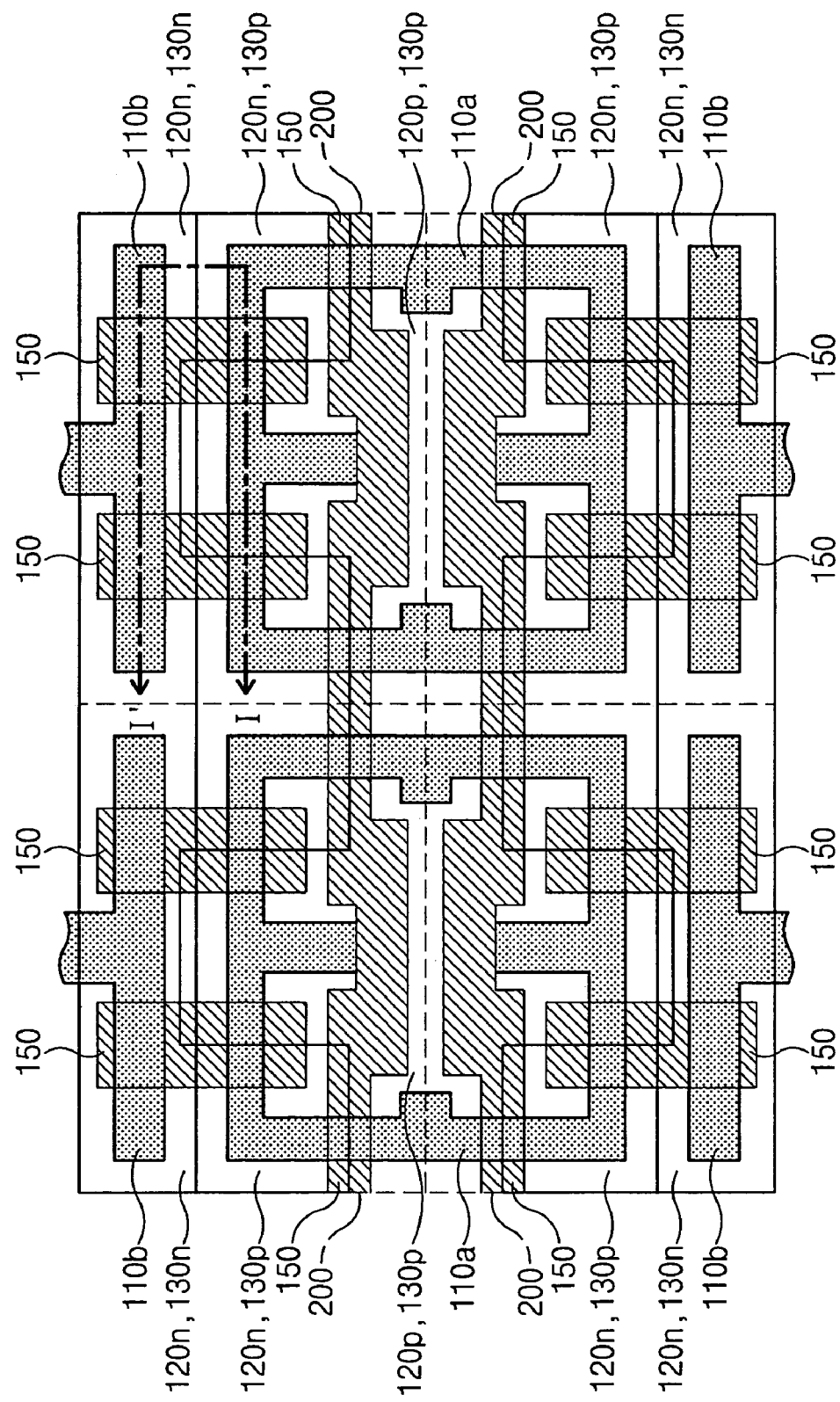
Figure 8B:
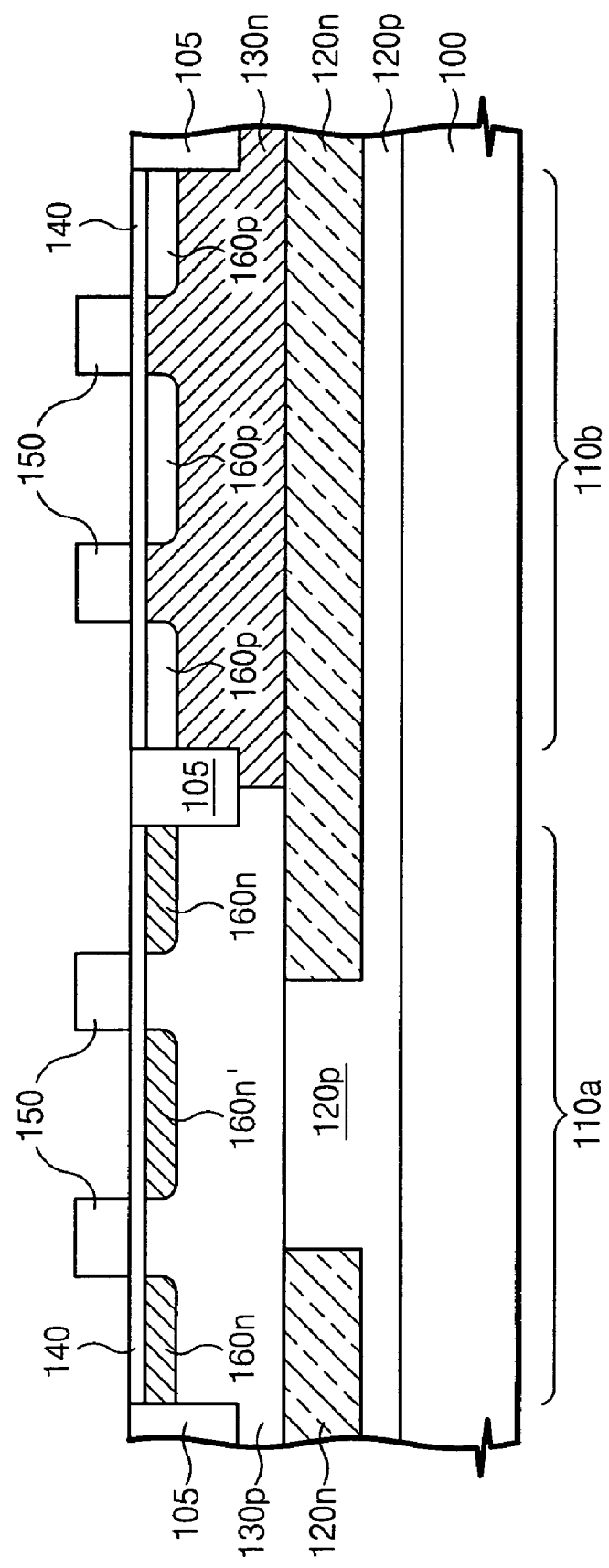

Referring to FIGS. 8A and 8B, a gate insulation layer 140 is formed on the semiconductor substrate where the P-well 130p and the N-well 130n are formed, using a conventional technique (e.g., a thermal oxidation process).

A gate conductive pattern 150 to be used as the gate electrode of the transistor is formed on the gate insulation layer 140. Afterwards, at least two ion implantation processes are performed, which have different open regions according to the conductivity type of the transistors. The ion implantation processes use the gate conductive patterns 150 as an ion implantation mask in addition to conventional photoresist patterns (not shown). As a result, first impurity regions 160n and 160n' of N-type are formed in the first active region 110a neighboring the gate conductive patterns 150. Second impurity regions 160p of P-type are formed in the second active region 110b neighboring the gate conductive patterns 150.

The first impurity regions 160n and 160n' and the gate conductive pattern 150 compose the first and second driver transistors TD1 and TD2 and the first and second transfer transistors TA1 and TA2 shown in FIG. 4. In addition, the second impurity regions 160p and the gate conductive patterns 150 compose the first and second load transistors TL1 and TL2.

Afterwards, an interconnection process is further performed to connect the first and second impurity regions 160p, 160n and 160n' to the gate conductive patterns 150 so as to connect the transistors to form a CMOS SRAM cell.

According to the present invention, the deep N-wells are locally disposed under a drain of the NMOSTET which is weak in a soft error. Therefore, funneling length of a high-energy particle can be reduced and the generated electrodes can be effectively discharged. As a result, a CMOS device has low susceptibility with respect to the soft error.

In addition, the P-well where the NMOSFET is formed is connected to the deep P-well between the deep N-wells. Therefore, the electric resistance of the P-well can be reduced to fabricate a CMOS device having low susceptibility with respect to the latch up.

In summary, according to one embodiment of the present invention, first wells of first conductivity type and second wells of second conductivity type are formed in a first conductivity type semiconductor substrate. First conductivity type MOSFETs having a first conductivity type source/drain are formed in the second well, and second conductivity type MOSFETs having a second conductivity type source/drain are formed in the first well. A third well of second conductivity type is formed under both the first wells and a drain of the second conductivity type MOSFETs.

The first conductivity type may be P type, and the second conductivity type may be N type. The first conductivity type MOSFETs and the second conductivity type MOSFETs may compose a CMOS inverter or a flip-flop circuit. In addition, the first conductivity type MOSFETs composes load transistors of SRAM, and the second conductivity type MOSFETs may compose driver transistors and transfer transistors of the SRAM. In addition, the first well may be connected to the semiconductor substrate between the third wells.

A fourth well of first conductivity type can be disposed in the semiconductor substrate under the third wells and between the third wells. In this case, the first wells are connected to the fourth well between the third wells. In addition, the third well may be connected to a bottom of the second well, and may be formed at the region under the entire second well.

The present invention may be adapted to an SRAM semiconductor device including first and second driver transistors formed in a semiconductor substrate, first and second transfer transistors and first and second load transistors. The SRAM semiconductor device includes an N-well where the first and second driver transistors are located, a P-well where the first and second transfer transistors are located, and an N-well where the first and second load transistors are located. In addition, a deep N-well is located in the region under both drains of the driver transistors and the P-well.

A deep P-well connected to a bottom of the P-well may be disposed between the deep N-wells. In this case, the deep P-well may be disposed under the deep P-well at an entire region of the semiconductor substrate. In addition, the deep N-well may be connected to a bottom of the deep N-well.

The present invention also provides a method of forming the described semiconductor device. The method includes forming a well locally at a predetermined region of the semiconductor substrate. The method also includes a step of forming first wells of first conductivity type and second wells of second conductivity type in the semiconductor substrate. Third wells of second conductivity type are formed in the semiconductor substrate, which are connected to the second well and disposed under a predetermined region of the first wells. Afterwards, the first conductivity type MOSFETs including a first conductivity type are formed in the second well, and second conductivity type MOSFETs including second conductivity type source/drain are formed in the first well.

The step of forming the first wells may be performed before or after the second wells are formed, and the step of forming the third wells may be performed before or after the first wells and the second wells. The step of forming the first conductivity type MOSFETs may be performed before or after the second conductivity type MOSFETs.

In addition, the step of forming a fourth well of first conductivity type under the third wells and in the semiconductor substrate between the third wells may be performed before or after the third wells are formed.

Preferably, the first conductivity type is P type, and the second conductivity type is N type; the alternative is possible. In addition, after the first MOSFETs and the second MOSFETs are formed, interconnections for connecting source/drain terminals of the first and second MOSFETs may be further formed so as to make the first MOSFET and the second MOSFET form a CMOS inverter. In this case, the third wells may be further formed under a source/drain terminal of the first MOSFETs connected to by the interconnections.

The present invention provides a method of forming a semiconductor device for forming a deep N-well locally in a predetermined region of the semiconductor substrate. This method includes a step of forming P-wells and N-wells disposed over the deep N-well in the semiconductor substrate after deep N-wells are formed in a predetermined region of the semiconductor substrate. In this case, the P-wells are connected to the semiconductor substrate between the deep N-wells, and the N-wells are connected to the deep N-well. Load transistors of the SRAM are formed in the P-well, and driver transistors of SRAM and transfer transistors are formed in the N-well. Preferably, the deep N-well is formed in the region under both the drain of the driver transistor and the P-well.

A person skilled in the art will be able to practice the present invention in view of the description present in this document, which is to be taken as a whole. Numerous details have been set forth in order to provide a more thorough understanding of the invention. In other instances, well-known features have not been described in detail in order not to obscure unnecessarily the invention.

While the invention has been disclosed in its preferred embodiments, the specific embodiments as disclosed and illustrated herein are not to be considered in a limiting sense. Indeed, it should be readily apparent to those skilled in the art in view of the present description that the invention may be modified in numerous ways. The invention includes all combinations and sub-combinations of the various elements, features, functions and/or properties disclosed herein.

The following claims define certain combinations and sub-combinations, which are novel and non-obvious.

I claim:

1. A CMOS semiconductor device comprising:
a first well of a first conductivity type and a second well of a second conductivity type formed in a semiconductor substrate of the first conductivity type;
first conductivity type MOSFETs including source/drain of the first conductivity type formed in the second well;
second conductivity type MOSFETs including source/drain of the second conductivity type formed in the first well;
a third well of the second conductivity type disposed under the second well and the drains of the second conductivity type MOSFETs; and
a fourth well of the first conductivity type disposed in the semiconductor substrate under and between portions of the third well.

2. The circuit of claim 1, wherein the first conductivity type is P type and the second conductivity type is N type.

3. The circuit of claim 1, wherein the first conductivity type MOSFETs and the second conductivity type MOSFETs comprise a CMOS inverter or a flip-flop circuit.

4. The circuit of claim 1, wherein the first conductivity type MOSFETs comprise load transistors of an SRAM cell, and the second conductivity type MOSFETs comprise driver transistors and transfer transistors of the SRAM cell.

5. The circuit of claim 2, wherein the first well is connected to the semiconductor substrate between the third wells.

6. The circuit of claim 1,
wherein the first well is connected to the fourth well between the portions of the third well.

7. The circuit of claim 1, wherein the third well is connected to a bottom of the second well.

8. The circuit of claim 7, wherein the third well is formed at a substantially entire region under the second well.

9. A semiconductor device comprising:
   a semiconductor substrate;
   first and second driver transistors, first and second transfer transistors and first and second load transistors connected to form an SRAM cell, disposed on said semiconductor substrate;
   a P-well in said semiconductor substrate where the first and second driver transistors and the first and second transfer transistors are disposed;
   an N-well in said semiconductor substrate where the first and second load transistors are disposed;
   a deep N-well disposed under drains of the driver transistors and said N-well; and
   a deep P-well disposed under the deep N-well and between portions of the deep N-well.

10. The device of claim 9, wherein the deep P-well is connected to a bottom of the P-well.

11. The device of claim 10, wherein the deep P-well is disposed under the deep N-well at an entire region of the semiconductor substrate.

12. The device of claim 9, wherein the deep N-well is connected to a bottom of the N-well.

13. A semiconductor device comprising:
   a first well of a first conductivity type and a second well of a second conductivity type formed in a semiconductor substrate of the first conductivity type;
   a first transistor including impurity regions of the first conductivity type formed in the second well;
   a second transistor including impurity regions of the second conductivity type formed in the first well;
   a third well of the second conductivity type disposed under the second well and under a first portion of the first well adjacent to the second well and beneath an impurity region of the second transistor; and
   a fourth well of the first conductivity type disposed under a second portion of the first well adjacent to the first portion of the first well, wherein the fourth well is laterally adjacent to the third well and is disposed under the third well.

14. The semiconductor device of claim 13, wherein the first and second transistors are load and driver transistors, respectively, of a static random access memory device.

* * * * *

UNITED STATES PATENT AND TRADEMARK OFFICE
CERTIFICATE OF CORRECTION

PATENT NO. : 7,294,889 B2 Page 1 of 1
APPLICATION NO. : 10/961927
DATED : November 13, 2007
INVENTOR(S) : Hycuk-Chai Jung It is certified that error appears in the above-identified patent and that said Letters Patent is hereby corrected as shown below:

Column 5, line 55, the words "130puses" should read -- 130p uses --.

Signed and Sealed this

Twenty-third Day of September, 2008

JON W. DUDAS
*Director of the United States Patent and Trademark Office*